United States Patent
Cho

(10) Patent No.: US 6,914,196 B2
(45) Date of Patent: Jul. 5, 2005

(54) REEL-DEPLOYED PRINTED CIRCUIT BOARD

(75) Inventor: Sung Dae Cho, Chungcheongnam-do (KR)

(73) Assignee: Samsung Electronics Co., Ltd., Suwon (KR)

(*) Notice: Subject to any disclaimer, the term of this patent is extended or adjusted under 35 U.S.C. 154(b) by 499 days.

(21) Appl. No.: 09/827,112

(22) Filed: Apr. 5, 2001

(65) Prior Publication Data

US 2001/0050846 A1 Dec. 13, 2001

Related U.S. Application Data

(62) Division of application No. 09/219,407, filed on Dec. 23, 1998, now Pat. No. 6,235,555.

(30) Foreign Application Priority Data

Jan. 9, 1998 (KR) .............................................. 98-00377

(51) Int. Cl.[7] ................................................. H05K 1/09
(52) U.S. Cl. ........................ 174/254; 174/255; 174/268; 361/749; 361/783; 29/894.2
(58) Field of Search ................................ 174/255, 254, 174/260, 268, 124, 69; 361/749–751, 782–784; 29/894.2, 830, 831, 846; 235/492, 488; 257/659; 438/110, 111, 112

(56) References Cited

U.S. PATENT DOCUMENTS

| | | | | |
|---|---|---|---|---|
| 5,173,840 A | * | 12/1992 | Kodai et al. ................. | 361/395 |
| 5,362,955 A | * | 11/1994 | Haghiri-Tehrani .......... | 235/492 |
| 5,438,750 A | * | 8/1995 | Venambre ..................... | 29/829 |
| 5,519,201 A | * | 5/1996 | Templeton, Jr. et al. .... | 235/492 |
| 5,661,086 A | * | 8/1997 | Nakashima et al. ........ | 257/668 |
| 5,900,674 A |   | 5/1999 | Wojnarowski et al. ...... | 257/774 |
| 5,936,227 A | * | 8/1999 | Trüggelmann et al. ..... | 235/492 |
| 6,027,958 A |   | 2/2000 | Vu et al. ..................... | 438/110 |
| 6,028,774 A | * | 2/2000 | Shin et al. .................. | 361/764 |
| 6,147,401 A |   | 11/2000 | Solberg ....................... | 257/723 |
| 6,288,904 B1 | * | 9/2001 | Houdeau et al. ............ | 361/760 |
| 6,288,905 B1 | * | 9/2001 | Chung ......................... | 361/771 |

FOREIGN PATENT DOCUMENTS

| | | | | | |
|---|---|---|---|---|---|
| JP | 05013502 | * | 1/1993 | ........... | H01L/21/60 |
| JP | 11274348 | * | 10/1999 | ........... | H01L/23/12 |

* cited by examiner

Primary Examiner—David L. Talbott
Assistant Examiner—Jose H. Alcala
(74) Attorney, Agent, or Firm—Harness, Dickey & Pierce, P.L.C.

(57) ABSTRACT

A reel-deployed printed circuit board for chip-on-board (COB) packages and a method for manufacturing COB packages using the reel printed circuit board are disclosed. The novel circuit board comprises an elongated, flexible base board and a plurality of unit boards defined within it by a plurality of slits cut through it. Each unit board comprises a plurality of bonding pads on its top surface, a plurality of contacts on its bottom surface, and a plurality of via holes that electrically connect the contacts to the bonding pads. The circuit board further comprises connection bars that connect the unit boards to the flexible base board. The method for manufacturing COB packages using the reel-deployed printed circuit board comprises the steps of forming the reel printed circuit board, attaching a semiconductor chip to it, connecting the semiconductor chip to the bonding pads, encapsulating the semiconductor chip, and separating the COB packages from the reel printed circuit board.

36 Claims, 8 Drawing Sheets

REEL-DEPLOYED PRINTED CIRCUIT BOARD

CROSS-REFERENCE TO RELATED CASES

This application is a divisional of U.S. patent application Ser. No. 09/219,407, filed Dec. 23, 1998, now U.S. Pat. No. 6,235,555, the contents of which is incorporated herein in its entirety by reference.

BACKGROUND

1. Field of the Invention

The present invention generally relates to reel-deployed printed circuit boards for chip-on-board (COB) packages and a method for manufacturing IC packages using such circuit boards.

2. Description of the Related Art

In many applications, such as telephone cards, credit cards and identification cards, integrated circuit (IC) cards can advantageously replace conventional magnetic strip cards. The IC card typically includes a "chip-on-board" (COB) package in which a semiconductor integrated circuit chip is connected to a printed circuit board and is encapsulated with an encapsulant. COB packages are manufactured in several different ways, depending on the type of printed circuit board and the encapsulating methods used. Among these, a COB package using a reel-deployed printed circuit board is preferred due to lower production costs and higher assembly productivity.

FIG. 1 is an exploded perspective view of an IC card 10 which has a card body portion 11 with a COB package 20 assembled into it. FIG. 2 is a cross-sectional view of the IC card 10 shown in FIG. 1. FIGS. 3 and 4 are top and bottom views, respectively, of a COB package 20 of the type shown in FIGS. 1 and 2. As shown in FIG. 1, the COB package 20 is inserted into a cavity in the body 11 of the card 10. Thus, the card body 11 includes an adhesion area 12 to which the COB package 20 is attached, and a cavity 13 for receiving an encapsulated portion 24 of the COB package 20.

Referring to FIG. 2, in manufacturing the COB package 20, a semiconductor chip 21 is attached to a top surface of a printed circuit board 30 by an adhesive 22, and bonding wires 23 electrically connect the semiconductor chip 21 to bonding pads 31 formed on the top surface of the printed circuit board 30. The semiconductor chip 21, bonding pads 31, and bonding wires 23 are all then encapsulated with an encapsulant to seal and protect them from the environment. As shown in FIG. 4, the other side, that is, a bottom surface of the printed circuit board 30, typically has a plurality of contacts 33 which are exposed on the card when the COB package 20 is assembled into the card body 11 in the orientation shown. The contacts 33 are electrically connected to the bonding pads 31 on the top surface by plated-through holes 32, sometimes called "via holes." Non-conductive gaps 34 on the bottom surface electrically isolate the contacts 33 from each other. As shown in FIGS. 3 and 5, a dam 35 prevents runoff of the liquid encapsulant and gives shape to the encapsulated portion 24 of the package.

FIG. 5 shows a conventional reel-deployed printed circuit board 40 which is used to manufacture a plurality of the COB packages 20 simultaneously in successive manufacturing steps, as depicted from left to right in the figure. In FIG. 5, reference numeral 37 indicates the outline of an individual COB package 20.

To prepare the reel-deployed printed circuit board 40 for the encapsulation step, a dam 35 is formed on the top surface of the board. Among the various encapsulation methods available, a method that dispenses a liquid encapsulant onto the semiconductor chip and the wire bonding area and then cures the encapsulant in place, is preferred for COB packages that use a reel-deployed printed circuit board 40. In such a process, the dam 35 prevents runoff of the liquid encapsulant and acts as a mold to shape the encapsulated portion outlined by the dam. The printed circuit board 40 further includes sprocket holes 41, position holes 42, assembly-reject holes 43a and test-reject holes 43b, the functions of which are described below.

An "in-line" system such as that described above can theoretically manufacture COB package 20 without any interruptions between consecutive assembly steps. However, as a practical matter, an unbalanced production capability among the steps can make operation of the in-line system difficult and inefficient. Further, an interruption of the line at any one point can halt the entire assembly line, and thereby reduce the productivity of the entire manufacturing process. In view of this, an alternative manufacturing method, one that performs each manufacturing process, or step, independently of the others, and which uses a reel hub 50, such as the one shown in FIG. 6, for conveniently storing the reel-deployed printed circuit board 40 between manufacturing steps, and for transferring it from step to step, becomes more preferable.

In this alternative method, a, reel-deployed printed circuit board 40 is initially provided in the form of a long strip wound onto a spool, as shown in FIG. 6. At each independent step, or stage, in the manufacturing process, the printed circuit board 40 is wound off of the reel hub 50, a process step is performed on it, and the board 40 is then wound onto another reel hub 50 for interim storage and conveyance to the next-succeeding manufacturing step.

The reel hub 50 thus may be seen as an almost indispensable tool for the practical mass-assembly of COB packages of the type that use a reel-deployed printed circuit board 40. Without it, the assembly could, at best, be carried out using only a short, strip-type printed circuit board. COB assembly methods using reel-deployed printed circuit boards 40 usually result in a much higher productivity than assembly methods using a strip-type printed circuit board. For example, a reel hub having a diameter of 330 mm is typically capable of holding about 30,000 COB packages 20 simultaneously.

In FIG. 6, reference numeral 40a indicates the top surface of a reel-deployed printed circuit board 40 on which the encapsulated portion 24 is formed, and reference numeral 40b indicates the bottom surface of the circuit board 40 on which the contacts 33 are formed. Those skilled in the art will recognize that it may be desirable to temporarily insert an optional "interposer" (not shown) over the circuit board 40 after the die-is attached and wire-bonded but before it is encapsulated, to protect the fragile bonding wires 23 (see FIG. 2) until the encapsulant is in place. The interposer can then be removed after the encapsulation is complete.

Although the use of reel-deployed printed circuit boards 40 can enhance the productivity of COB packages 20, their use can also result in an adverse effect. In particular, when the reel-deployed printed circuit board 40 is wound off of the reel hub 50, the board 40 may not be desirably flat, but rather, curved to a certain extent. That is, the circuit board 40 may take an arcuate "set" while it is wound on the circular hub of the reel that remains in the board when it is removed from the reel.

FIG. 7 illustrates the undesirable curvature that a conventional reel-deployed printed circuit board 40 can assume after it is removed from a storage reel. Typically, the encapsulation and curing steps produce a slight warpage of the COB package 20 anyway, because of a mismatch of thermal expansion coefficients between the encapsulant and the semiconductor chip 21. Thus, a warped printed circuit board 40, such as that shown in FIG. 7, can then exacerbate the warpage of the COB package 20. This warpage can cause an attachment failure between the card body 11 and the COB package 20, as shown in FIG. 8. Further, any protrusion of the COB package 20 from the surface of IC card 10 caused by this warpage of the COB package body will promote premature wear of the contacts 33, and thereby decrease the usable life and reliability of the IC card 10.

SUMMARY OF THE INVENTION

In one aspect of the present invention, a reel-deployed printed circuit board includes a flexible base board and multiple unit boards formed in the base board for manufacturing COB packages. The unit boards include a die bonding area and multiple wire bonding pads on a top surface thereof, a plurality of contacts on a bottom surface thereof, and via holes which electrically connect the contacts to corresponding ones of the bonding pads. The top surface can further include a dam to define an encapsulating portion.

The reel-deployed printed circuit board further includes slits formed around the perimeters of the unit boards to partially separate them from the flexible base board, and connection bars for connecting them to the base board. The slits enable the unit boards to remain flat when the flexible base board becomes warped. The connection bars are cut to separate the unit boards from the flexible base board after assembly of the COB packages is complete. Preferably, the flexible base board is made of a glass-epoxy material.

The reel-deployed printed circuit board may further comprise multiple sprocket holes formed along one or both edges of the base board for advancing and aligning the board during manufacture of the COB packages, and multiple position holes formed along one edge of the board to distinguish that edge from the other edge of the board.

In another aspect, the present invention provides a method for manufacturing COB packages using the reel-deployed printed circuit board described above. The method includes providing the reel printed circuit board, attaching a semiconductor chip, connecting the semiconductor chip to the bonding pads, encapsulating the semiconductor chip and bonding wires, and separating the COB packages from the flexible base board. The encapsulation can include dispensing and curing a liquid encapsulant.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and in which.

DETAILED DESCRIPTION OF THE PREFERRED EMBODIMENTS

Figure 9:
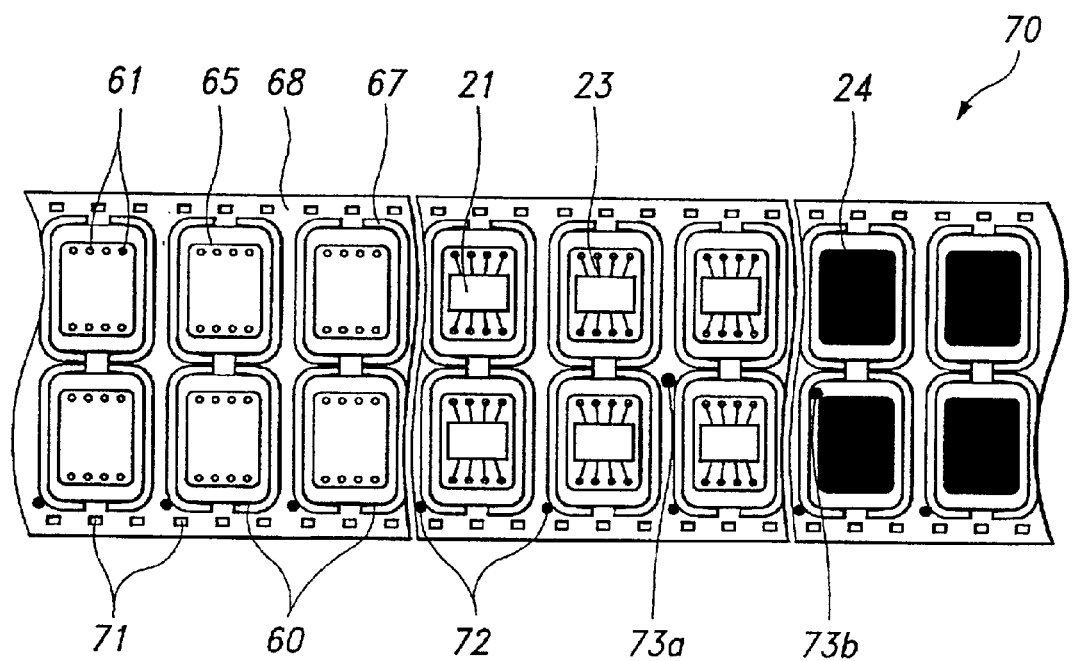
FIG. 9 is a top view of a reel-deployed printed circuit board according to one embodiment of the present invention.
Figure 10A:
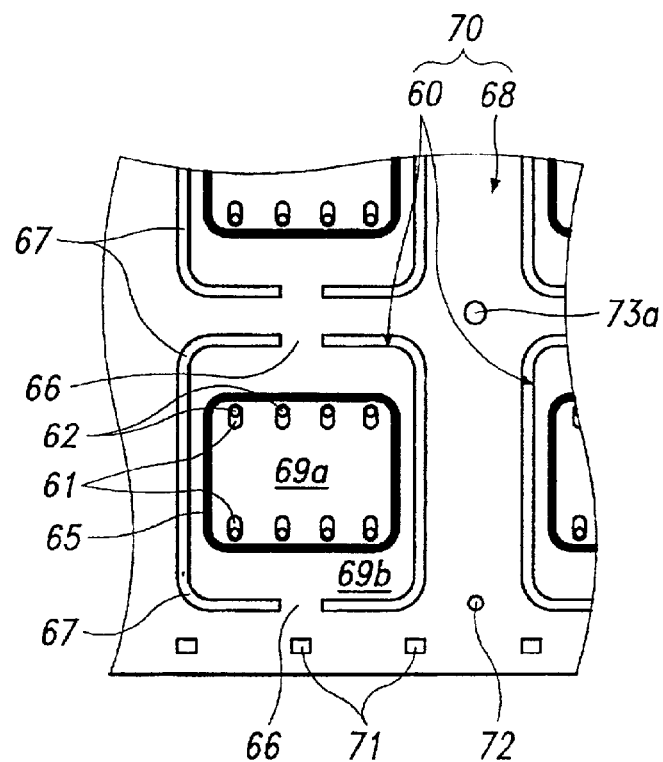
FIG. 10A is an enlarged top view of the reel-deployed printed circuit board of FIG. 9.
Figure 10B:
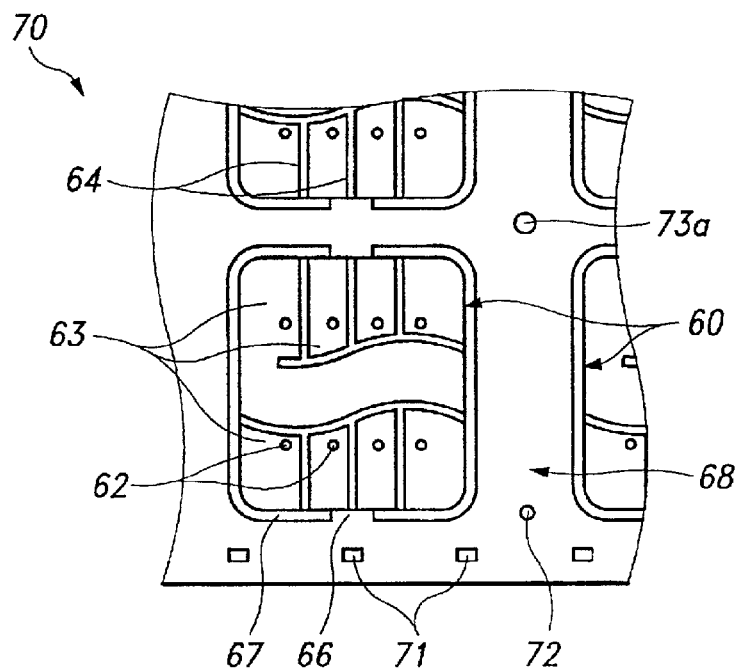
FIG. 10B is an enlarged bottom view of the reel-deployed printed circuit board of FIG. 9.

FIG. 9 is a top view of a reel-deployed printed circuit board 70 according to one embodiment of the present invention, and FIGS. 10A and 10B show respectively a top and a bottom surface of the reel printed circuit board 70 of FIG. 9. As shown in FIG. 9, the circuit board 70 includes an unfeatured flexible base board 68, with a plurality of unit boards 60, each of which constitutes a nascent COB package, defined within it by means of a plurality of slits 67. The features of the unit boards 60 are formed on the flexible base board 68 by conventional printed circuit board manufacturing methods.

Figure 6:
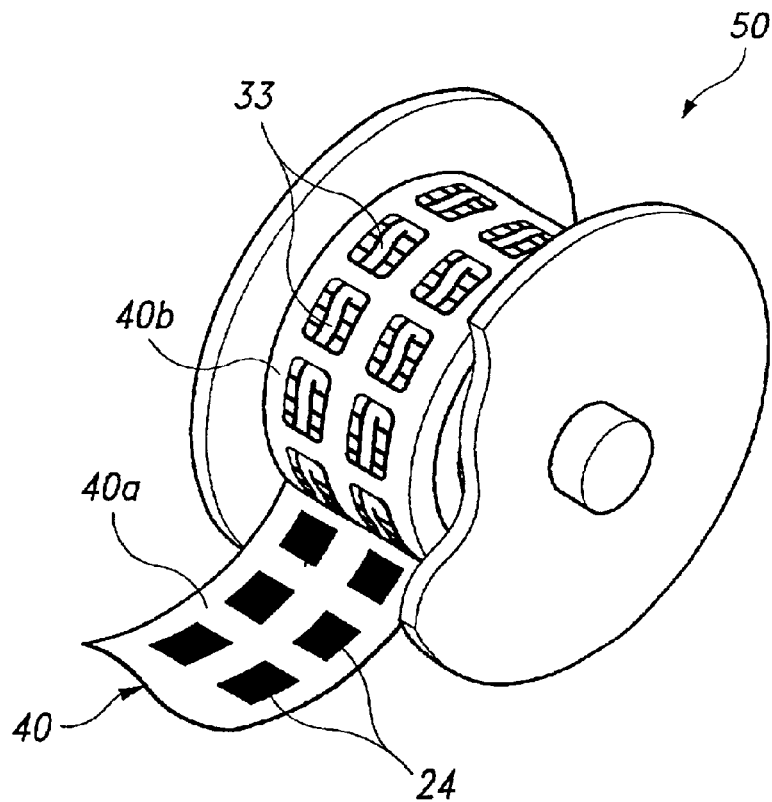
FIG. 6 is a perspective view of a reel on which the reel-deployed printed circuit board of FIG. 5 is spooled.

With reference to FIG. 9, the circuit board 70 further includes sprocket holes 71, position holes 72, assembly-reject holes 73a, test-reject holes 73b, and the slits 67. The sprocket holes 71 are formed along one or both edges of the circuit board 70 at regular intervals, and engage with a toothed sprocket mechanism (not illustrated) to advance and align the circuit board 70 with processing equipment. The position holes 72 are formed along only one edge of the board 70 to distinguish it from the other edge of the board 70. Assembly-reject holes 73a serve to mark the packages that do not meet assembly specifications, and test-reject holes 73b serve to mark the packages that fail any electrical tests. The slits 67 and their function are described in more detail below. The flexible base board 68 is preferably made of thin, flexible glass-epoxy sheets, thereby enabling the circuit board 70 to be spooled, or wound, onto a cylindrical reel hub 50 (see FIG. 6) and transported about in that condition.

FIGS. 10A and 10B illustrate in detail the unit boards 60, which all have identical elements, and which are formed on the printed circuit board 70 at uniform intervals. The top surface (see FIG. 10A) of a unit board 60 includes a die bonding, or chip attachment, area 69a to which a semiconductor chip 21 is attached. The top surface also includes bonding pads 61, which are electrically connected to the semiconductor chip 21 (see FIG. 2), for example, by fine bonding wires 23, and a dam 65, which prevents runoff of a liquid encapsulant and thereby defines an encapsulation portion 24 (FIG. 9) of the package. An outer region of the dam 65 serves as a card attachment area 69b, and is adhered to the adhesion area 12 of the card body 11 (see FIGS. 1 and 2).

The bottom surface (FIG. 10B) of the unit board 60 includes contacts 63, which are typically made of a thin copper layer plated with gold. The contacts 63 are electrically isolated by gaps 64 in the conductive plating and electrically connected to respective ones of the bonding pads 61 on the top surface of the board by plated-through via holes 62. The top surface can further include a wiring pattern (not shown) which connects certain bonding pads 61 to respective via holes 62.

According to the embodiment shown in FIG. 9, when the reel-deployed printed circuit board 70 is unreeled from the reel hub 50 to start package assembly, the slits 67 enable the unit boards 60 to lay flat, even though the circuit board 70 may retain a curved shape as a consequence of having been wound on the circular reel hub 50. As shown in FIGS. 10A and 10B, the slits 67 are formed along the perimeters of the unit boards 60, and the connection bars 66 are formed at their lateral ends. The slits 67 serve to separate the unit boards 60 from the flexible base board 68, and the connection bars 66 serve to retain the unit boards 60 connected to the flexible base board 68 until they are severed.

It is preferable that the connection bars 66 be as narrow as possible, consistent with maintaining a reliable connection between the unit boards 60 and the flexible base board 68 during processing. The orientation of the connection bars 66 is such that they are not bent when the circuit board 70 is wound onto the reel hub 50, i.e., the connection bars 66 are oriented perpendicular to the longitudinal direction of the printed circuit board 70 such that they remain straight when the board is wound onto the reel. The unit boards 60 are free to pivot on the connection bars and to lay flat independently of the printed circuit board 70 because the unit boards 60 are disconnected at their margins from the flexible base board 68 by the slits 67.

Figure 11:
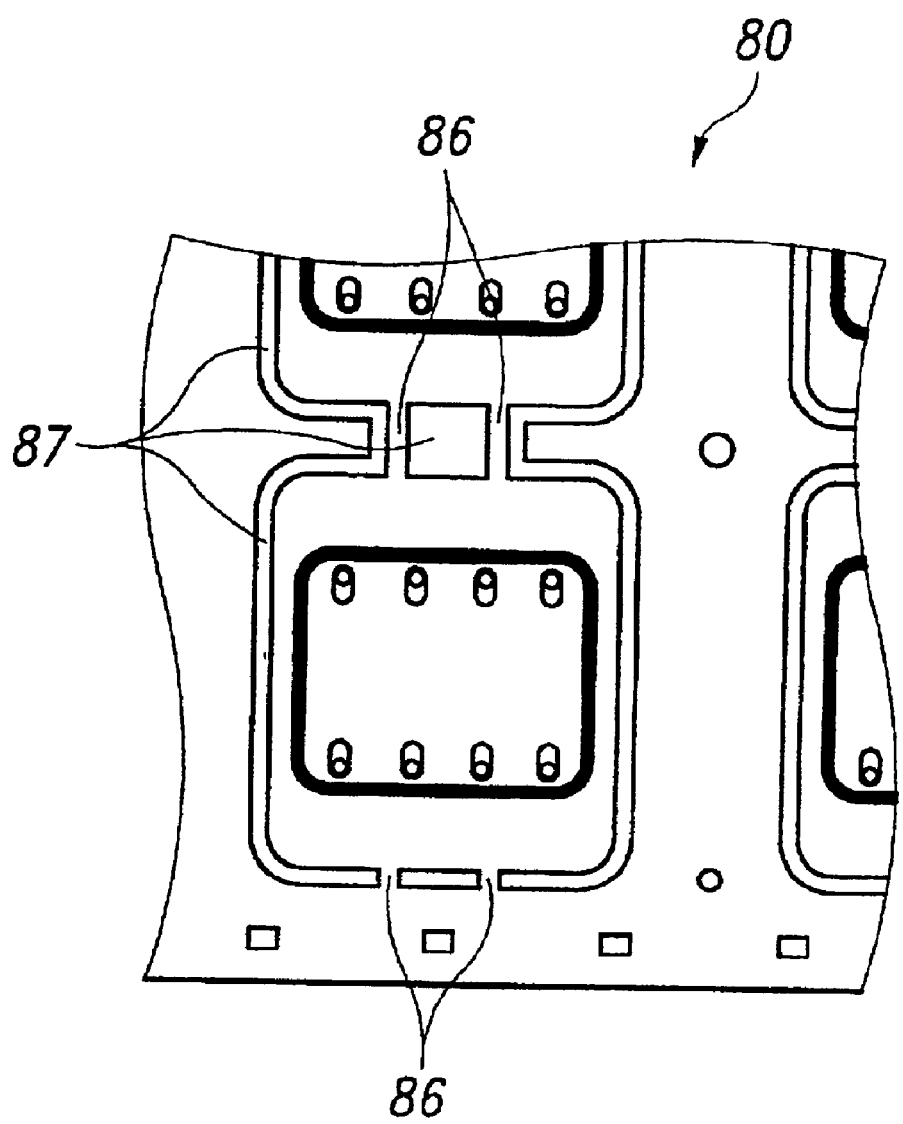
FIG. 11 is an enlarged top view of a reel-deployed printed circuit board according to another embodiment of the present invention.

FIG. 11 is a top plan view of a reel-deployed printed circuit board 80 according to another embodiment of the present invention. The circuit board 80 includes slits 87 and connection bars 86 which are different in form and number from the slits 67 and the connection bars 66 of the embodiment illustrated in FIG. 10A. That is, the slits and the connection bars of the present invention can have many variations and modifications.

Figure 7:
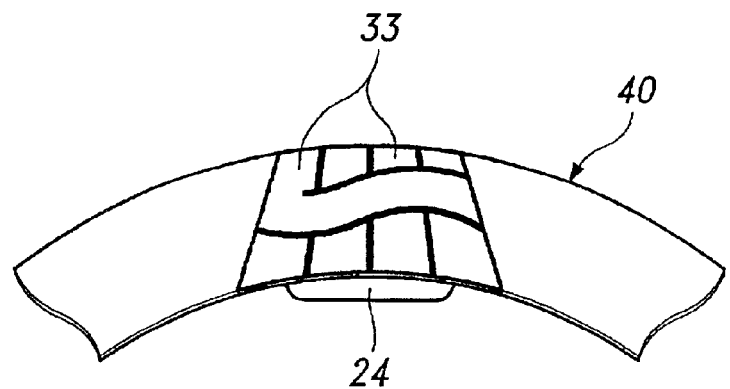
FIG. 7 is a partial perspective view of a warped COB circuit board.
Figure 8:
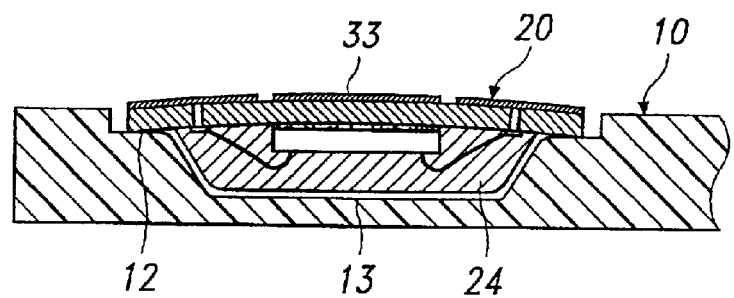
FIG. 8 is a partial cross-sectional view of an IC card assembly failure due to a warpage of the COB package.
Figure 12:
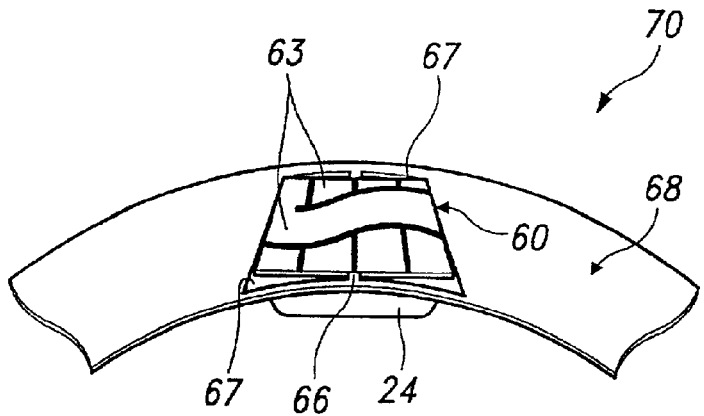
FIG. 12 is a schematic view of a COB package manufactured in accordance with the present invention; and, FIG. 13 is a flow chart of a COB package manufacturing process using a reel-deployed printed circuit board in accordance with the present invention.

As shown in FIG. 12, a COB package assembled with a unit board 60 of the embodiment illustrated in FIG. 10A is not as warped as the flexible base board 68 from which it is formed. A comparison of the novel circuit board 70 shown in FIG. 12 to the conventional circuit board 40 shown in FIG. 7 clearly reveals one of the advantages of the present invention over the prior art: The reel-deployed printed circuit board 70 of the present invention prevents the conventional attachment failure between the card body 11 and the COB package in FIG. 8 caused by a warped COB package body.

Skilled practitioners will recognize that the slits 67 can lessen the warpage of a COB package in another way. As explained above, the encapsulation of a COB package usually results in some slight warpage of the COB package because of the mismatch of thermal expansion coefficients between the semiconductor chip 21, the circuit board 70 and the encapsulant. In the absence of any slits 67, this warpage can also warp the adjacent flexible base board 68 and unit boards 60, and thus, aggravate the warpage of the adjacent COB packages. However, the addition of the slits 67 can prevent this aggravated warpage. Thus, the benefit from the slits 67 described above can be achieved just as readily in a strip-type printed circuit board that is deployed in a flat condition as in the case of a reel-deployed printed circuit board 70 of the type described above.

Figure 13:
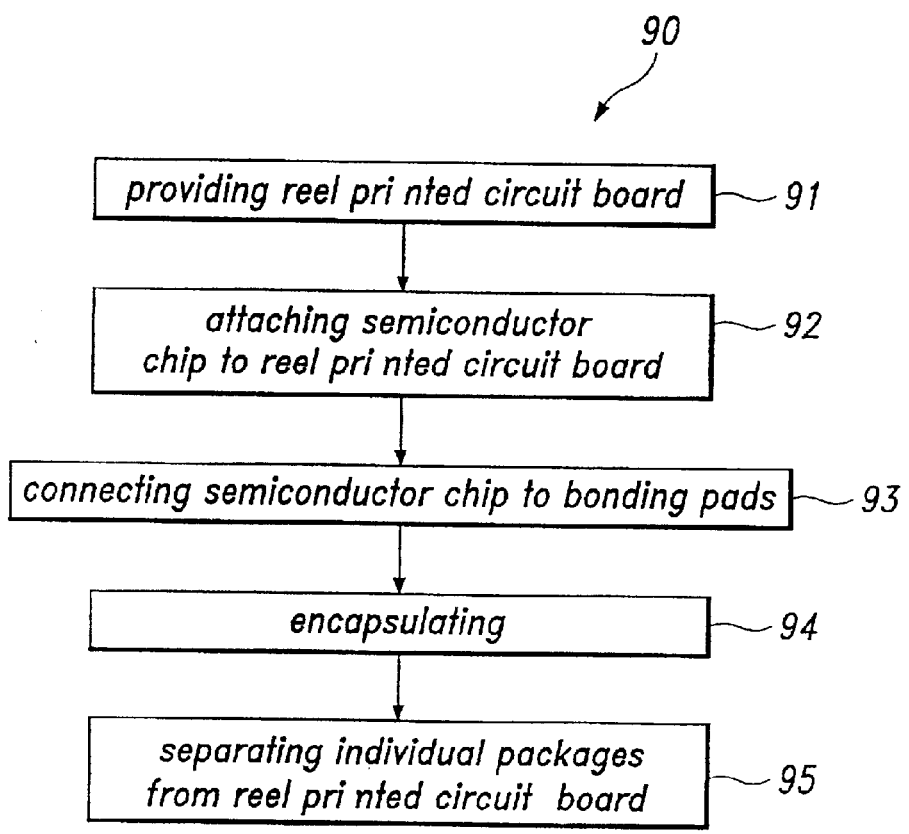

Another aspect of the present invention provides a method for manufacturing COB packages using the reel-deployed printed circuit board 70 described above. FIG. 13 is a flow chart describing a method 90 for manufacturing COB packages using a reel-deployed printed circuit board 70 in accordance with the present invention. As shown in FIG. 13, the novel COB package manufacturing method 90 includes providing a reel-deployed printed circuit board (step 91), attaching a semiconductor chip to it (step 92), electrically connecting the chip to the circuit board (step 93), encapsulating the chip and connection region of the board (step 94), and separating the COB packages from the circuit board (step 95). These steps will be described in detail with reference to FIGS. 9, 10A, 10B and 13.

The first step 91 of the novel method 90 is the provision of a reel-deployed printed circuit board 70, the structural details of which are described above. In this method, the circuit board and associated package components are wound onto cylindrical reels, which are used for storing the board and assembled components between processing steps and for transporting them from one step to the next.

After the provision of reel printed circuit board 70, a semiconductor chip 21 is attached to the top surface of each unit board 60 (step 92) and electrically connected to bonding pads 61 on the top surface of the board (step 93). Either a wire bonding method or a so-called "flip-chip" bonding method can achieve the electrical connection of the semiconductor chip 21 to the bonding pads 61. The middle segment of FIG. 9 shows a semiconductor chip 21 which is attached to a unit board 60 and electrically connected to bonding pads 61 by bonding wires 23.

Next, the top surface of the unit board 60, including the region of the chip-to-board bonding area, is encapsulated (step 94). Optionally, a liquid encapsulant dispensing method or a transfer molding method may be used to encapsulate the semiconductor chip 21 and the connection region between the semiconductor chip 21 and the unit board 60. The right-hand segment of FIG. 9 shows the encapsulated region 24 of the circuit board 70. In case of the dispensing method, which dispenses and the cures a liquid encapsulant on the to-be-encapsulated portion, a dam 65 prevents runoff of the encapsulant and thereby defines the shape of the encapsulated portion 24.

Figure 1:
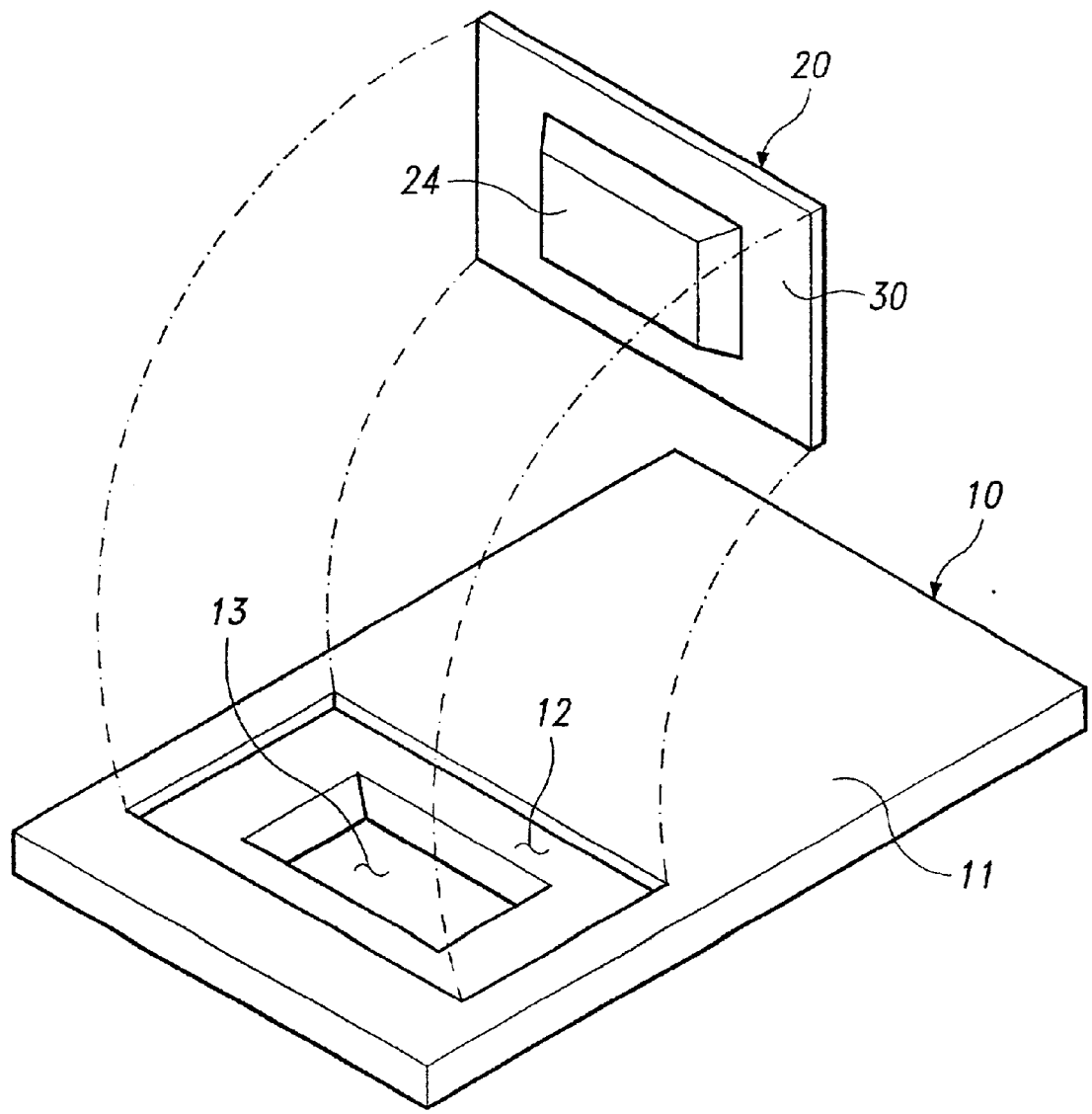
FIG. 1 is an exploded perspective view of the assembly of a chip-on-board (COB) package onto an IC card.
Figure 2:
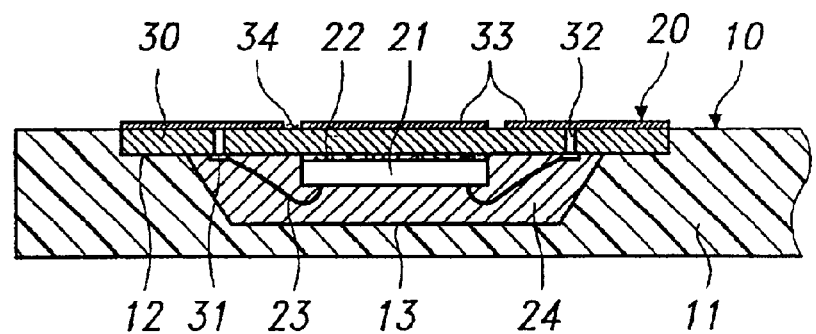
FIG. 2 is a partial cross-sectional view of the IC card of FIG. 1 after assembly.
Figure 3:
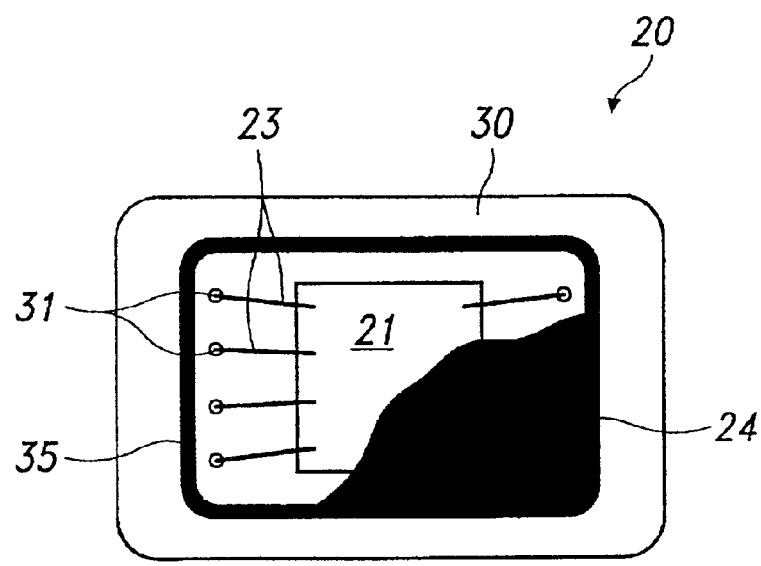
FIG. 3 is a top view of the COB package of FIG. 1 with the encapsulant shown partially broken away.
Figure 4:
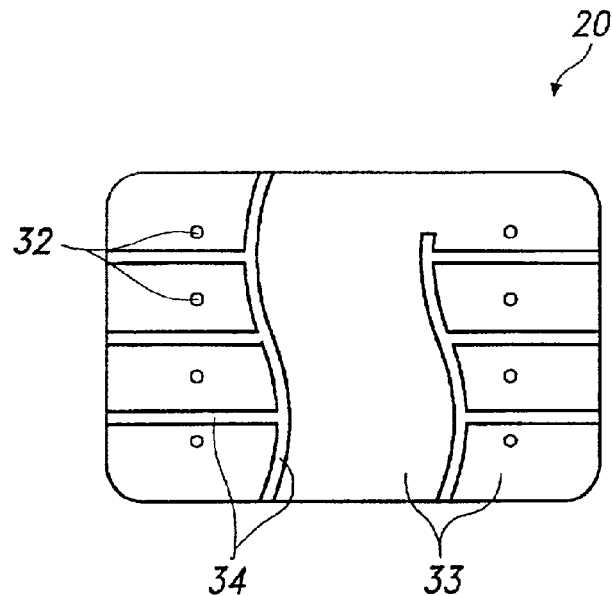
FIG. 4 is a bottom view of the COB package of FIG. 1.
Figure 5:
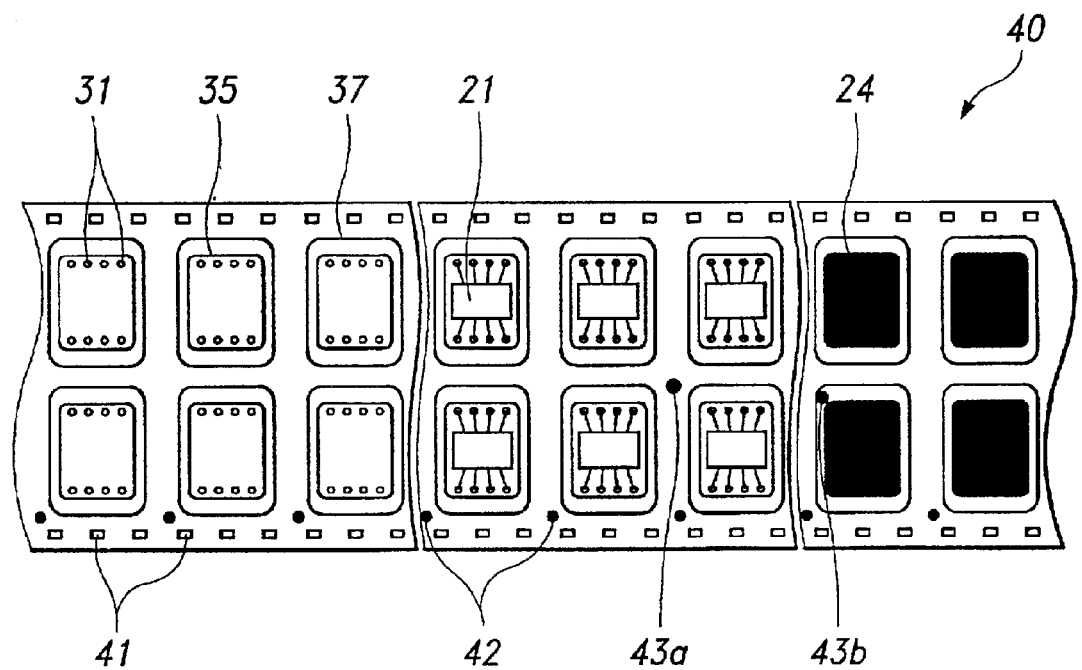
FIG. 5 is a top view of a conventional reel-deployed printed circuit board showing the successive steps involved in the manufacture of COB packages.

After the encapsulation step 94, individual COB packages are separated from the reel printed circuit board 70 by cutting the connection bars 66 (step 95). The individual COB packages are then ready to be assembled with card body 11 (FIG. 1) to produce a finished IC card 10 (FIG. 1).

In summary, the use of the reel-deployed printed circuit board having slits and connection bars enables the efficient mass production of COB packages without significant warpage of the package, and thereby improves the reliability and longevity of IC cards which employ the COB packages.

Although exemplary embodiments of the invention have been described in detail above, it should be clearly understood that many variations and/or modifications of the basic inventive concepts taught herein which may appear to those skilled in the art will still fall within the spirit and scope of the present invention as defined in the appended claims.

What is claimed is:

1. A printed circuit board mounted on a reel, comprising:
   an elongated, flexible base board having opposite edges and a slit formed into it, the slit having an inner periphery defining a unit board within the flexible base board; and
   at least one connection bar having an axis that is oriented perpendicular to a direction of travel at which the printed circuit board is removed from or wound onto the reel, the connection bar connecting the unit board to the base board such that the unit board is pivotable on the connection bar relative to the base board.

2. The circuit board of claim 1, further comprising:
   a bonding pad on a top surface of the unit board;
   a contact on a bottom surface of the unit board; and
   a via hole through the unit hoard electrically connecting the bonding pad to the contact.

3. The circuit board of claim 2, wherein the contact comprises a layer of copper plated with gold.

4. The circuit board of claim 1, further comprising a dam inside the inner periphery of the slit.

5. The circuit board of claim 1, wherein the base hoard is made of a glass-epoxy material.

6. The circuit board of claim 1, wherein the base board includes a sprocket hole along at least one of the edges thereof.

7. The circuit board of claim 1, wherein the base board includes a position hole along one of the edges thereof.

8. The circuit board of claim 2, further comprising:
   a semiconductor chip attached to an upper surface of the unit board, the chip having a connection pad on an upper surface thereof; and
   a conductive wire having opposite ends, each bonded to a respective one of the bonding pad on the unit board and the connection pad on the chip.

9. The circuit board of claim 8, further comprising an encapsulant formed on the top surface of the unit board and encapsulating a region including the chip, the conductive wire, the bonding pad, and the connection pad.

10. An apparatus mounted on a reel, comprising:
    a flexible base board; and
    a plurality of unit boards disposed within the flexible base board, the plurality of unit boards connected to the flexible base board by at least one connection bar having an axis that is oriented perpendicular to a direction of travel at which the apparatus is removed from or wound onto a reel, wherein each unit board is pivotable on its respective connection bar(s).

11. The apparatus of claim 10, further comprising:
    bonding pads on a top surface of the unit boards;
    contacts on a bottom surface of the unit boards; and
    via holes through the unit boards electrically connecting the bonding pads to the contacts.

12. The apparatus of claim 11, wherein the contacts comprises a layer of copper plated with gold.

13. The apparatus of claim 10, wherein the base board has opposite edges and a slit formed therein, further comprising dams disposed at the periphery of the slit.

14. The apparatus of claim 10, wherein the base board is made of a glass-epoxy material.

15. The apparatus of claim 10, wherein the base board includes a sprocket hole along at least one of the edges thereof.

16. The apparatus of claim 10, wherein the base board includes a position hole along one of the edges thereof.

17. The apparatus of claim 11, further comprising:
    semiconductor chips attached to an upper surface of the unit boards, the chips having connection pads on an upper surface thereof; and
    conductive wires having opposite ends, each bonded to a respective one of the bonding pads on the unit boards and the connection pads on the chips.

18. The apparatus of claim 17, further comprising a protective cover formed on the top surfaces of the unit boards.

19. A printed circuit board mounted on a reel, comprising:
    an elongated, flexible base board having opposite edges and a slit formed into it, the slit having an inner periphery defining a Unit board within the flexible base board; and
    one or more connection bars connecting the unit board to the base board, the connection bar(s) being disposed such that an axis of the connection bar(s) is perpendicular to a direction of travel of the printed circuit board on the reel.

20. The circuit board of claim 19, further comprising:
    a bonding pad on a top surface of the unit board;
    a contact on a bottom surface of the unit board; and
    a via hole through the unit board electrically connecting the bonding pad to the contact.

21. The circuit board of claim 20, wherein the contact comprises a layer of copper plated with gold.

22. The circuit board of claim 19, further comprising a dam inside the inner periphery of the slit.

23. The circuit board of claim 19, wherein the base board is made of a glass-epoxy material.

24. The circuit board of claim 19, wherein the base board includes a sprocket hole along at least one of the edges thereof.

25. The circuit board of claim 19, wherein the base board includes a position hole along one of the edges thereof.

26. The circuit board of claim 20, further comprising:
a semiconductor chip attached to an upper surface of the unit board, the chip having a connection pad on an upper surface thereof; and
a conductive wire having opposite ends, each bonded to a respective one of the bonding pad on the unit board and the connection pad on the chip.

27. The circuit board of claim 26, further comprising an encapsulant formed on the top surface of the unit board and encapsulating a region including the chip, the conductive wire, the bonding pad and the connection pad.

28. The circuit board of claim 1, wherein the slit is formed around a circumference of the unit board so that the unit board lay substantially flat, even with the flexible base board retaining a curved shape from being wound onto or from the reel.

29. The circuit board of claim 1, wherein the at least one connection bar remains substantially straight as the printed circuit board is wound onto or off of the reel.

30. The apparatus of claim 10, wherein the slit is formed around a circumference of the unit board so that the unit board lay substantially flat, even with the flexible base board retaining a curved shape from being wound onto or from the reel.

31. The apparatus of claim 10, wherein the at least one connection bar remains substantially straight as the apparatus is wound onto or off of the reel.

32. The circuit board of claim 19, wherein the slit is formed around a circumference of the unit board so that the unit board lay substantially flat, even with the flexible base board retaining a curved shape from being wound onto or from the reel.

33. The circuit board of claim 19, wherein the connection bar(s) remain substantially straight as the printed circuit board is wound onto or off of the reel.

34. A printed circuit board, comprising:
an elongated base board having a substantially curved shape, the elongated base board having opposite edges and a slit formed into it, the slit having an inner periphery defining a unit board within the base board; and
at least one connection bar connecting the unit board to the base board so that the unit board is pivotable on the connection bar relative to the base board, and so that the connection bar remains substantially flat, even with the base board retaining a substantially curved shape.

35. The circuit board of claim 34, wherein the slit is formed around a circumference of the unit board so that the unit board lay substantially flat, the base board retaining a curved shape from being wound onto or removed from a reel.

36. The printed circuit board of claim 34, wherein the base board has a substantially curved shape due to being mounted on a reel.

* * * * *